(12) United States Patent
Harshbarger et al.

(10) Patent No.: US 11,689,906 B2
(45) Date of Patent: Jun. 27, 2023

(54) PLUG-IN POD FOR ELECTRONIC CONTROL UNIT

(71) Applicant: Cummins Inc., Columbus, IN (US)

(72) Inventors: Daniel R. Harshbarger, Columbus, IN (US); Nikhil Pandey, Columbus, IN (US); Joseph L. Gahimer, Columbus, IN (US)

(73) Assignee: Cummins Inc., Columbus, IN (US)

( * ) Notice: Subject to any disclaimer, the term of this patent is extended or adjusted under 35 U.S.C. 154(b) by 0 days.

(21) Appl. No.: 16/740,594

(22) Filed: Jan. 13, 2020

(65) Prior Publication Data
US 2020/0154251 A1 May 14, 2020

Related U.S. Application Data

(62) Division of application No. 15/175,395, filed on Jun. 7, 2016, now Pat. No. 10,567,938.

(51) Int. Cl.
| | |
|---|---|
| *F01N 9/00* | (2006.01) |
| *H04W 4/70* | (2018.01) |
| *F01N 3/10* | (2006.01) |
| *F01N 3/20* | (2006.01) |
| *F01N 3/035* | (2006.01) |
| *F02D 41/26* | (2006.01) |
| *H05K 5/00* | (2006.01) |
| *H05K 7/02* | (2006.01) |
| *H04W 4/80* | (2018.01) |

(52) U.S. Cl.
CPC .............. *H04W 4/70* (2018.02); *F01N 3/035* (2013.01); *F01N 3/103* (2013.01); *F01N 3/2066* (2013.01); *F01N 9/00* (2013.01); *F02D 41/26* (2013.01); *H05K 5/0065* (2013.01); *H05K 7/023* (2013.01); *H04W 4/80* (2018.02)

(58) Field of Classification Search
CPC ........ F01N 3/035; F01N 3/103; F01N 3/2066; F01N 9/00; F02D 41/26; H04W 4/70; H04W 4/80; H05K 5/0065; H05K 7/023
See application file for complete search history.

(56) References Cited

U.S. PATENT DOCUMENTS

| | | | | |
|---|---|---|---|---|
| 3,711,815 | A * | 1/1973 | Pierce ................. | H01R 13/562 |
| | | | | 439/319 |
| 4,899,256 | A * | 2/1990 | Sway-Tin ............... | F02P 3/02 |
| | | | | 361/715 |
| 9,663,065 | B2 | 5/2017 | Hanson et al. | |
| 2001/0021103 | A1 | 9/2001 | Takagi | |
| 2003/0008505 | A1 | 1/2003 | Chen et al. | |
| 2003/0085805 | A1 | 5/2003 | Paulo | |

(Continued)

*Primary Examiner* — Carl C Staubach
*Assistant Examiner* — Diem T Tran
(74) *Attorney, Agent, or Firm* — Foley & Lardner LLP

(57) ABSTRACT

A ruggedized engine control module (ECU) system includes a plugin-pod, a connector configured to connect the plugin-pod to a connector of an ECU, and signal processing circuitry. The ruggedized ECU system further includes a ruggedized enclosure for the connector and the signal processing circuitry. The ruggedized enclosure is configured to mount the plugin-pod to the ECU. The connection circuit includes signal processing circuitry configured to receive signals from at least one of the connectors, process the signals, and output the processed signals. The ruggedized ECU is configured to dissipate heat from the signal processing circuitry.

14 Claims, 11 Drawing Sheets

(56) References Cited

U.S. PATENT DOCUMENTS

| | | | |
|---|---|---|---|
| 2005/0056457 A1* | 3/2005 | Gall | H05K 1/0281 |
| | | | 174/254 |
| 2006/0122762 A1 | 6/2006 | Perkins | |
| 2010/0242449 A1 | 9/2010 | Paterson | |
| 2013/0066514 A1 | 3/2013 | Das | |
| 2014/0350764 A1 | 11/2014 | Arai et al. | |
| 2017/0347454 A1* | 11/2017 | Harashima | H01R 24/64 |

* cited by examiner

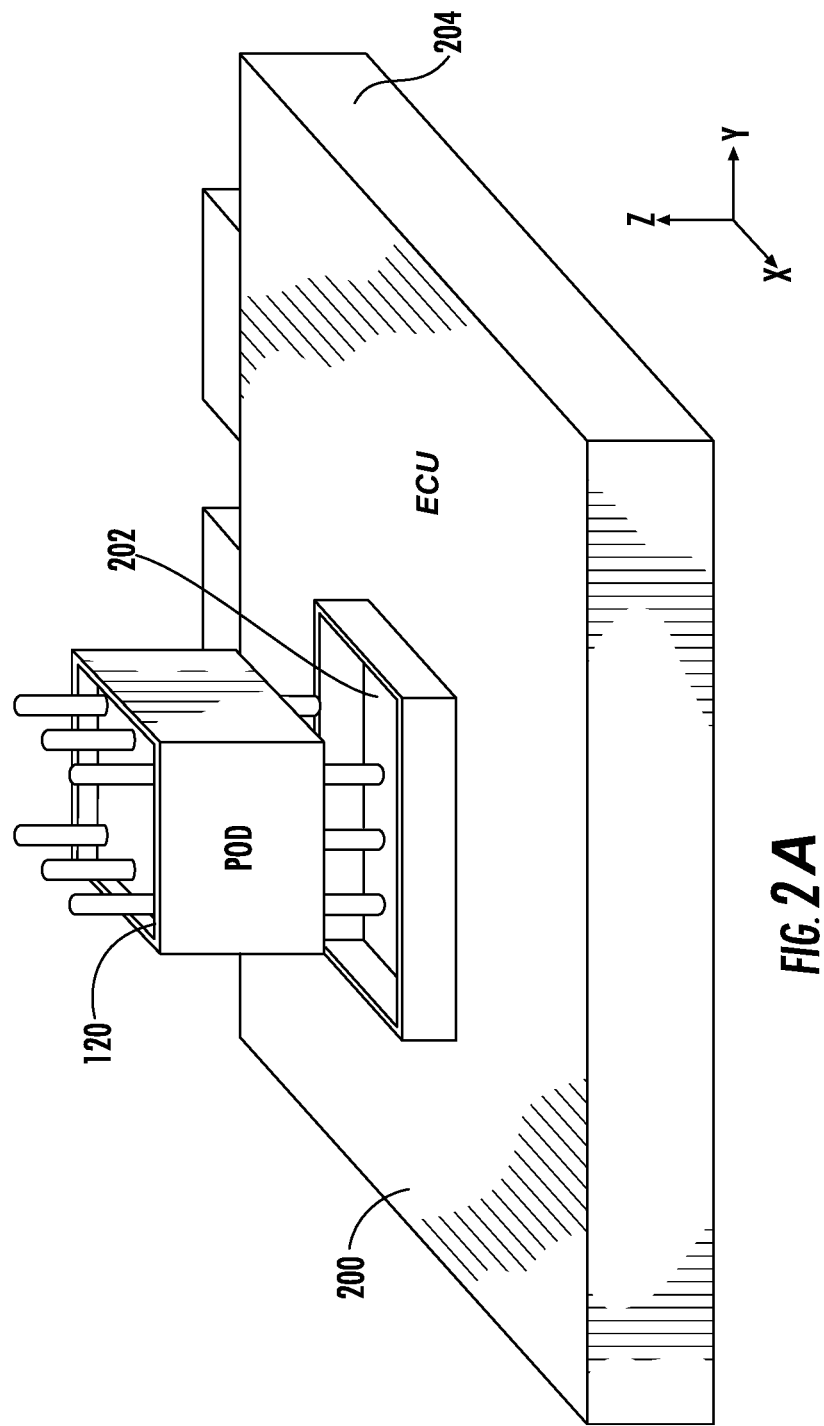

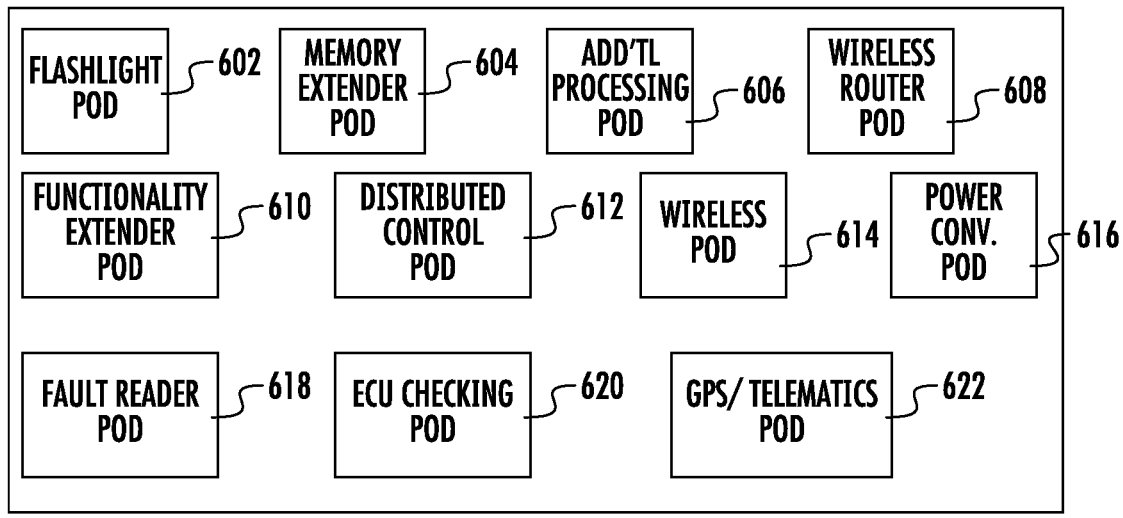
FIG. 6A
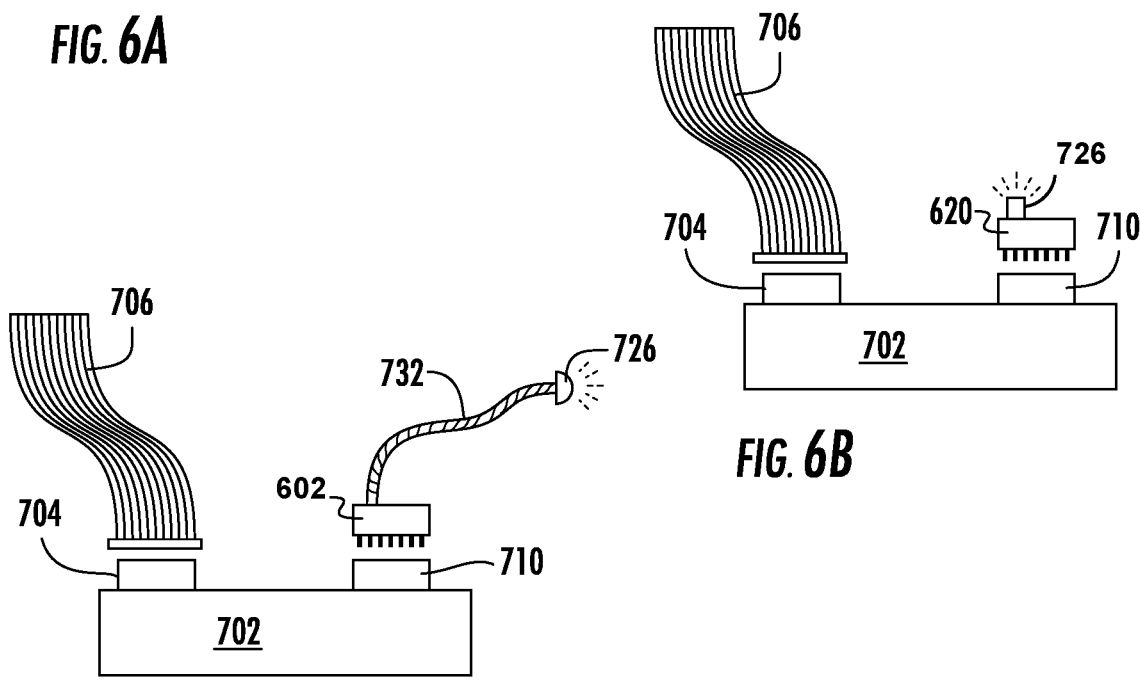
FIG. 6B
FIG. 6C
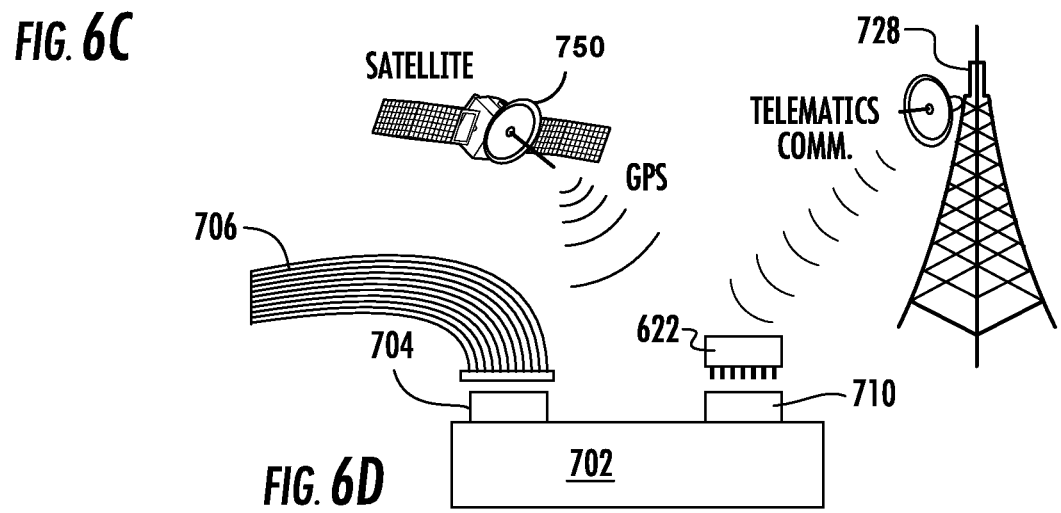
FIG. 6D

PLUG-IN POD FOR ELECTRONIC CONTROL UNIT

CROSS-REFERENCE TO RELATED APPLICATIONS

The present application is a divisional of and claims priority to U.S. application Ser. No. 15/175,395, filed Jun. 7, 2016, the entire contents of which are incorporated herein by reference.

TECHNICAL FIELD

The present disclosure relates to enclosed printed circuit board systems for electronic control units. More particularly, the present application relates to a plugin-pod for an electronic control unit (ECU), such as an engine control module (ECM).

BACKGROUND

An engine control unit (ECU) typically controls a multitude of actuators in a vehicle engine to improve and manage engine performance. A typical ECU generally extracts values from a numerous sensors within an application. The ECU typically adjusts actuation based on interpreting the extracted data. Further, the ECU generally includes one or more microcontrollers or microprocessors, a driver circuit, and connectors. These components are typically all mounted on a printed circuit board (PCB).

Engine management is becoming more dependent on electronics and is no longer solely reliant on mechanical measures such as hydraulic controls. With the expansion of electronics-based control, ECUs may be replaced and upgraded more frequently than before to accommodate various demands for expanding ECU functionality.

SUMMARY

One embodiment relates to an integrated electronic control unit (ECU) system, specifically, a ruggedized ECU and one or more plugin-pods. The one or more plugin-pods include a rigid or flexible PCB with electronic components and routing elements and one or more connectors and a hermetic enclosure. Further, one or more connectors of the plugin-pods are configured to mate with the ECU and/or with one or more other plugin-pods. The one or more connectors of the plugin-pods facilitates the plugin-pod's communication with the ECU and/or with other plugin-pods. In some instances, the one or more connectors may or may not be distinguishable as an "input connector" and/or an "output connector." Further, the one or more plugin-pods are specialized entities which are added to the ECU. For example, the one or more plugin-pods may include a plugin-pod configured as a wireless router or as a functionality extender to extend actuation and/or sensing capabilities.

The ECU includes a rigid or flexible PCB with routing elements and electronic components, and one or more connectors. The PCB itself is provided within a hermetic enclosure. Further, one or more, or none, of the connectors of the ECU are configured to mate with the one or more plugin-pods. The integrated ECU system is configured in such a manner that mating of the plugin-pods and the ECU is between the connectors of both the plugin-pod and the ECU, and hermetic enclosures of each of the plugin-pod and ECU may or may not be in contact with each other. The hermetic enclosures are configured to protect the ECU and the plugin-pods, respectively, from harsh automotive environmental conditions. In this embodiment, the one or more plugin-pods are added to an existing ECU to provide added functionality.

An additional embodiment relates to a wireless sensor system. The wireless sensor system includes an engine system with a plurality of wireless sensors and/or actuators, an ECU, and one or more plugin-pods. Further, the ECU is configured to maintain the functionality of an engine to support processes or sub-systems of the engine system. The ECU includes a rigid or flexible PCB with routing elements and electronic components, one or more connectors, and a hermetic enclosure. Further, one or more, or none, of the connectors of ECU are configured to mate with the one or more plugin-pods. Additionally, each of the plugin-pods is protected by a hermetic enclosure and is configured to connect to the ECU and function as a wireless router. Further, as a wireless router, the plugin-pod thereby facilitates communication between the ECU one or more of the plurality of wireless sensors.

Additionally, the enclosure and the one or more connectors are substantially dust-resistant and waterproof as per Ingress Protection Standards IP-69 and IP-69K as set forth pursuant to DIN 40050-9 and IEC 60529, and are configured to be operable at temperatures typical for automotive operation and in harsh environments, e.g., between about −40° C. and about 105° C., and to withstand high vibrations and a range of pressures.

An additional embodiment relates to an integrated electronic control system. The integrated engine control system includes an engine system with a plurality of sensors and/or actuators, an ECU and one or more plugin-pod(s). Further, the ECU is configured to maintain the functionality of the engine system and support processes and/or sub-systems of the engine system. The ECU includes a rigid or flexible PCB with routing elements and electronic components, one or more connectors, and a hermetic enclosure. Further, one or more, or none, of the connectors of the ECU are configured to mate with the one or more plugin-pods. Further still, one or more plugin-pods are protected by a hermetic enclosure and configured to connect to the ECU and function as a memory extender. In addition, as a memory extender, the plugin-pod extends existing memory capability of the ECU. Additionally, the enclosure and connectors are substantially dust-resistant and waterproof as per Ingress Protection Standards IP-69 and IP-69K as set forth pursuant to DIN 40050-9, and are configured to be operable at temperatures typical for automotive operation and in harsh environments, e.g., between about −40° C. and about 105° C., and to withstand high vibrations.

Yet another embodiment relates to an integrated electronic control system. The integrated engine control system includes an engine system with a plurality of sensors and/or actuators, an ECU and one or more plugin-pods. Further, the ECU is configured to maintain functionality of the engine and to support process and/or sub-systems of the engine system. The ECU includes a rigid or flexible PCB with routing elements and/or electronic components, one or more connectors and a hermetic enclosure. Further, one or more, or none, of the connectors of the ECU are configured to mate with the one or more plugin-pods. Further, each plugin-pod is protected by a hermetic enclosure and is configured to connect to ECU and serve as a functionality extender. As a functionality extender, the one or more plugin-pods extend existing actuation and/or sensing capabilities of the ECU by virtue of specialized circuitry inside the one or more plugin-pods. Additionally, the enclosure and connectors are substantially dust-resistant and waterproof as per Ingress Protection Standards IP-69 and IP-69K as set forth pursuant to DIN 40050-9 and IEC 60529, and are configured to be operable at temperatures typical for automotive operation and in harsh environments, e.g., between about −40° C. and about 105° C., and to withstand high vibrations.

A further embodiment relates to a kit. The kit includes an engine configured to be installed in a vehicle and an ECU configured to control the engine and comprising a PCB protected within a substantially hermetic enclosure. The kit further includes one or more plugin-pods that are compatible with the ECU and configured to connect externally to the ECU via a connector, receive signals from the connector, process the signals, and output the processed signals at the connector. The one or more plugin-pods are further configured to communicate with the engine so as to manage at least one characteristic output of the engine, and to extend functionality of the ECU.

These and other features, together with the organization and manner of operation thereof, will become apparent from the following detailed description when taken in conjunction with the accompanying drawings.

BRIEF DESCRIPTION OF THE FIGURES

FIGS. 2A and 2B are schematic diagrams of ECU configurations with the plugin-pods of FIGS. 1A-C, according to example embodiments.

FIGS. 6A, 6B, 6C, 6D, 6E, 6F and 6G are depictions of plugin-pod in various configurations, according to example embodiments.

DETAILED DESCRIPTION OF VARIOUS EMBODIMENTS

Figure 1A:
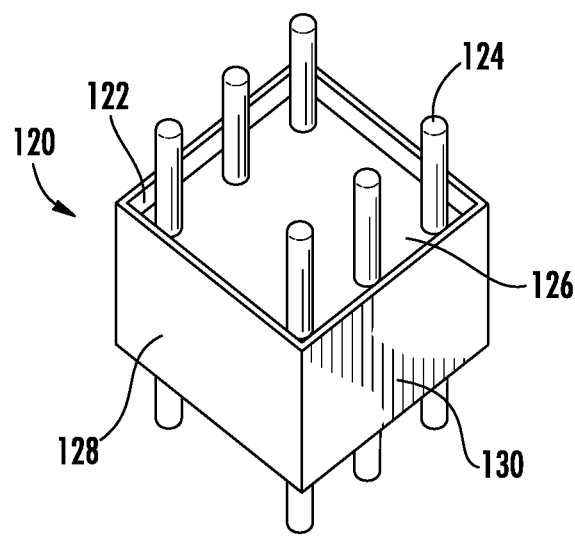
FIGS. 1A, 1B and 1C are depictions of a plugin-pod, according to example embodiments.

Referring to the figures generally, the various embodiments disclosed herein relate to systems and apparatuses including plugin-pods for ECUs.

To support expanding demands for ECU functionality, the present disclosure contemplates ECUs that comprise highly capable PCBs for multiple control applications. Such PCBs are provided in enclosures, as discussed further below. In order to encompass multiple control applications, such embodiments use a plurality of plugin-pods to increase functionality in accordance with various demands. Such plugin-pods can advantageously be removed or added during servicing or in the field.

The plugin-pods of various embodiments described herein allow for ECUs to be easily upgraded, replaced, and made backward-compatible. In particular, the plugin-pods allow for ECUs to be readily scaled up (e.g., by adding more plugin-pods). Furthermore, the plugin-pods provide for considerable design flexibility. Via the use of a plurality of such plugin-pods, an ECU system can be tailored to support a wide variety of applications.

As indicated above, an ECU according to various embodiments includes a common highly capable PCB, contained within a common enclosure (also referred to as a housing). The common PCB, in tandem with the plurality of plugin-pods, allows for execution of multiple control applications. In other words, the base ECU comprising the common PCB supports a set of 'base' applications, while the plugin-pods can be added to the ECU as desired to support additional application requirements. By virtue of such a configuration, the embodiments described herein permit manufacturing of the common PCB at high volumes so that large numbers of PCBs with a 'base' level of functionality can be produced at relatively lower cost. The plugin-pods can be used to satisfy requirements defined by particular applications that are not met by the base functionality. In this manner, scalability can be advantageously achieved.

Furthermore, by producing a higher volume of the common PCB, a lower cost per piece is attained. Additionally, because such embodiments could rely on one common PCB and a variety of plugin-pod PCBs, the non-recurring engineering costs are lower. Such costs are lower in as much as fewer total PCB designs are required. Also, the time to market may be reduced because only the relevant pod would need to be added to gain functionality, which may be accomplished in the field. The time to market can also be reduced for derivative ECUs with similar and/or analogous PCBs. In this manner, a highly cost-effective approach may be carried out to lower the number of application-specific modules while providing enhanced functionality and supporting new applications. The total cost of ownership may thereby be reduced as well.

In certain embodiments, the plugin-pods include circuitry for a plurality of different features. For example, such circuitry may include, but is not limited to, circuits for input buffering, output drivers or data link interfaces. For example, a plugin-pod may be used for a high horsepower (HHP) application. Such an HHP application may employ an H-bridge circuit, which enables a voltage to be applied across a load in either direction. An HHP application, for example, may use the H-bridge output to control an exhaust gas recirculation (EGR) valve. By way of further illustration, a plugin-pod may be used for a mid-range application. Such a mid-range application may involve a 3-phase brushless DC motor (BLDC). The HHP and BLDC applications are only two of the many possible applications which may be supported by plugin-pods according to the various embodiments.

Referring to the aforementioned applications, the present embodiments include plugin-pods, each of which is configured to be plugged into an ECU at the time of building the engine, in accordance with the requirements of the end application. However, as noted above, the addition and removal of plugin-pods are both performed externally to the base ECU. Thus, the external connections allow for plugin-pod addition and removal such that the ECU system may be configured during engine assembly, vehicle assembly, or servicing, for example.

Thus, in the present embodiments, the plugin-pods may serve as an embedded control system. As may be referred to herein, an embedded control system is a system with at least some dedicated functionality within a larger electrical, mechanical or electromechanical system. Further, an embedded control system is an electronic device that uses real-time data and is deterministic in nature. Such a system may employ distributed control, i.e., a control system which monitors inputs in real-time and changes outputs according to a set programming or logic. For example, for every input, an embedded control system may have a pre-defined logic/program which provides consistent outputs that are repeatable in nature. The plugin-pods may be embedded as part of a total assembly including various mechanical components, for example.

Further, in such embodiments, the connection from the plugin-pods to the engine (or to the vehicle itself) may be achieved in multiple ways. In a first example, the connection may be through a main ECU connector. In a second example, the connection may be made directly between harnesses of the engine (or the vehicle) and the plugin-pod. Such connections will be described in more detail below with reference to specific embodiments.

Figure 1B:
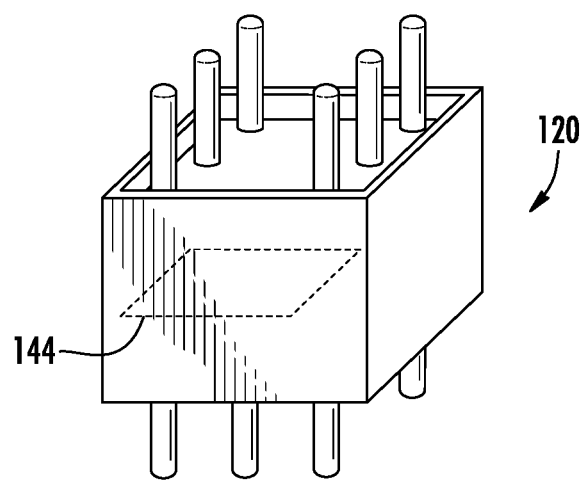

FIG. 1A is a perspective view of a plugin-pod (also referred to as an ECU adapter module, adapter module, ECU adapter connector, or adapter connector) 120. FIG. 1B is a front view of the plugin-pod 120. As shown in FIG. 1A, the plugin-pod 120 comprises an enclosure 128 with walls 122. The plugin-pod may further include a top set of connectors 124, and a bottom set of connectors 130. The enclosure 128 is a ruggedized enclosure offering protection against external environmental conditions, as is discussed below in more detail. At least one set of the connectors 124, 130 is configured to connect the plugin-pod 120 to a connector of an ECU (such as the ECU 200 shown in FIGS. 2A and 2B). Further, the plugin-pod 120 also includes signal processing circuitry that may be provided on a PCB 144 (shown in dashed lines in FIG. 1B) positioned beneath a seal member 126. The seal member provides further protection against environmental conditions for the PCB 144. The connectors 124, 130 may themselves be environmentally sealed. The ruggedized enclosure 128 encloses at least part of the connectors 124, 130 and the signal processing circuitry and is configured to mount the plugin-pod 120 to an ECU.

Figure 1C:
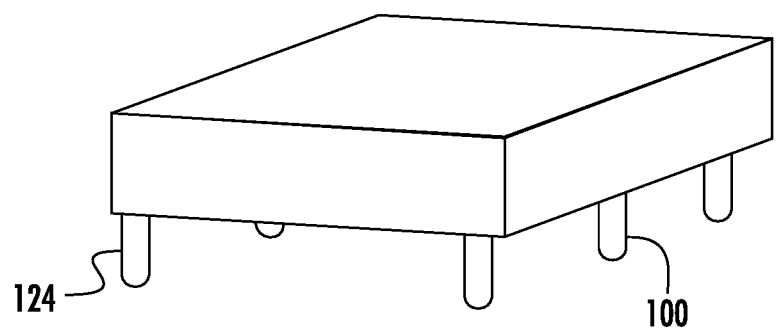

As shown in FIG. 1C, in some embodiments, the plugin-pod 120 does not include both sets of connectors 124, 130. Rather, a single set of connectors is provided that includes the functionality of both connectors 124, 130. Further, in some embodiments, an output connector may not be provided, because the same connector includes both input and output functionality. For example, a memory extender plugin-pod to provide extra storage for data may only include a single connector. By way of further illustration, a wireless router plugin-pod, as described in further detail later, may have an input through a connector and an output through a wireless link to at least one of an actuator, a sensor, another plugin-pod, or an application.

Referring again to FIG. 1A, the signal processing circuitry of the PCB 144 may be configured to receive signals from the connectors 124, 130, process the signals, and output the processed signals at the connectors 124, 130. Further, such signal processing circuitry may configured to be operable between about −40° C. and about 105° C., thus allowing the plugin-pod 120 to be used at a wide range of temperatures. Furthermore, the ruggedized enclosure 128 may be configured to dissipate heat from the signal processing circuitry.

Figure 2B:
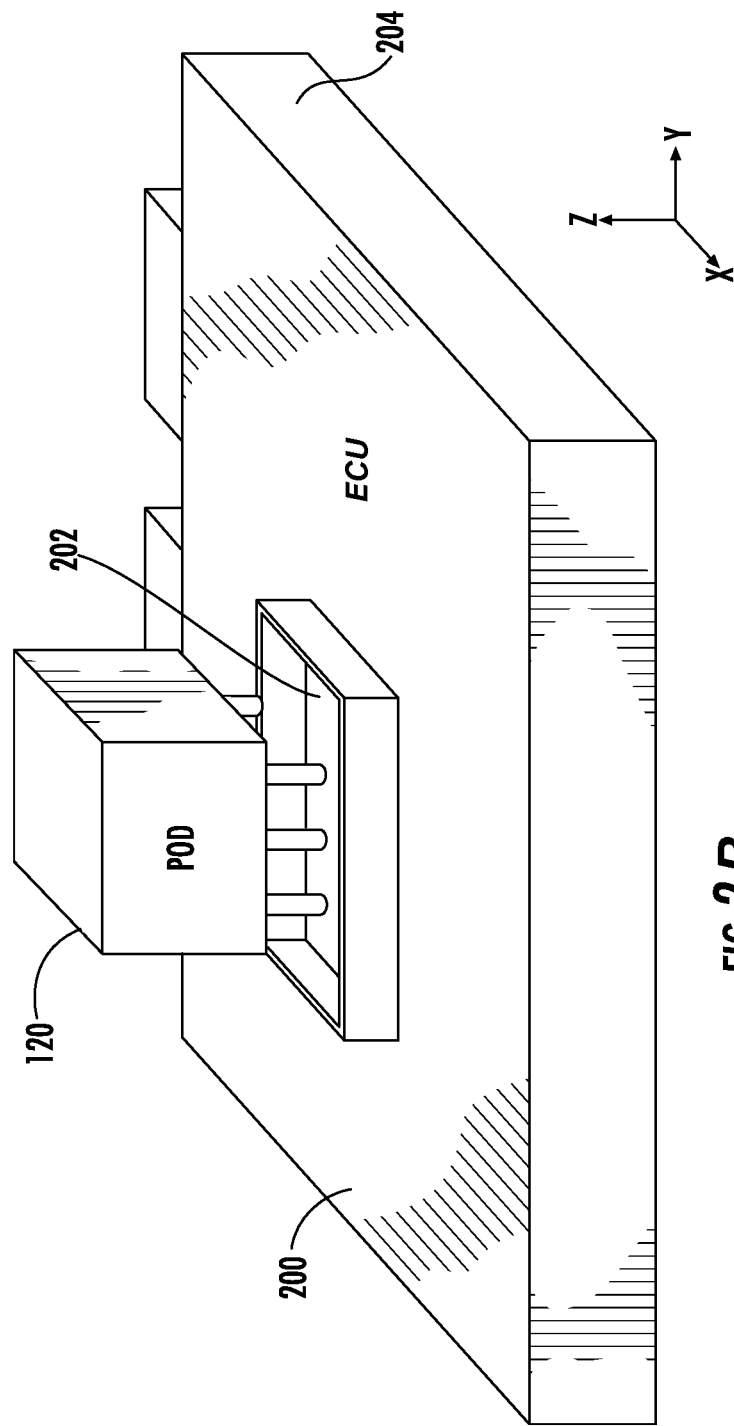

As shown in FIGS. 2A and 2B, the plugin-pod 120 is configured to interface with an ECU 200. The ECU 200 includes a ruggedized enclosure 204. The ruggedized enclosure 204 may be a hermetic enclosure. In typical usage conditions, the ECU 200 is subject to vibrations along the x-axis, the y-axis, and the z-axis. A position of the ECU 200 may be defined along an x-axis, a y-axis, and a z-axis. The plugin-pod 120 and the ECU 200 are configured to withstand a high vibration automotive environment. In particular, the plugin-pod 120 and the ECU 200 may be configured to withstand a high vibration automotive environment, along all three axes. Further, the enclosure 204 may be a single piece or a multi-piece assembly. The enclosure 204 is ruggedized so as to have sufficient strength and be impervious to water and dust.

Further, the ruggedized ECU 200 is chemically-resistant so as to withstand exposure to non-polar solvents, polar solvents, diesel fuel, motor oil, gas, brake fluid, engine oil, coolant, antifreeze, coffee, carbonated beverages, detergents, degreasers, grease and battery acid. The enclosure 204 of the ruggedized ECU may be made of metals, automotive grade plastics, or combinations thereof, so as to achieve appropriate structural strength.

As indicated above, the ECU 200 is typically subject to vibrations along its x, y and z axes. The harsh operating environment in which the ECU 200 is typically located exposes the ECU 200 to mechanical stresses as well as to dust and water. The ECU 200 is also structured to be substantially dust-resistant and waterproof as per standards IP-69 and IP-69K (Ingress Protection). Further, in some embodiments, the ECU 200 is configured to withstand pressure washing so as to be leak-resistant even under high pressure washes, with elevated water temperatures and in close proximity to a pressure washer nozzle.

Further, the enclosure 204 is sealed to stop water, sand or dust from entering. In at least some embodiments, the enclosure 204 is substantially dust-tight so as to offer substantially complete protection against contact, in accordance with Ingress Protection Code (IP Code) standards (e.g., to achieve IP 69K ratings). Additionally, in such embodiments, the enclosure 204 protects against liquid ingress when immersed in at least 1 m of liquid at a specified temperature and pressure. The enclosure 204 is further configured to be break-resistant when drop-tested by dropping from a height of 1 m onto concrete. Moreover, the enclosure 204 is resistant to humid environments and is configured to operate normally in environments of 95% humidity or less.

The ruggedized enclosure 204 is provided with an interface to permit connection with the plugin-pod 120. Also, the ruggedized enclosure 204, like the ruggedized enclosure 128 of the plugin-pod 120, is configured to withstand bombardment from gravel directed at the enclosure 204 at high pressure.

Figure 3:
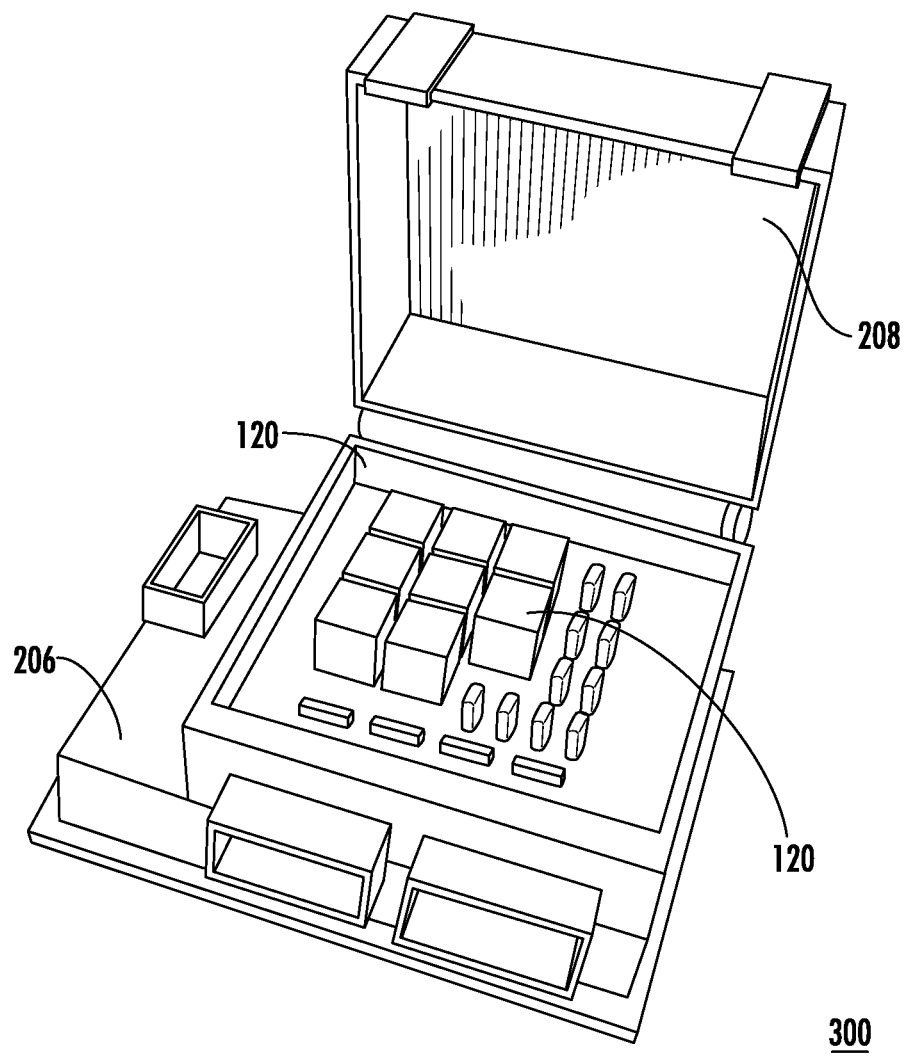
FIG. 3 is a depiction of a plugin-pod provided with various ECUs, according to an example embodiment.

Referring now to FIG. 3, a ruggedized assembly 300 is shown for an ECU such as ECU 200. The ruggedized assembly 300 includes a first ruggedized enclosure 206 and a second ruggedized enclosure 208. The ruggedized enclosure 206 may be similar and/or analogous to the ruggedized enclosure 204 shown in FIG. 2. In some embodiments, the ruggedized enclosure 206 protects at least a portion of the ECU. The ruggedized enclosure 208 may be similar and/or analogous to the ruggedized enclosure 128 of the plugin-pod 120 as shown in FIG. 1A. However, whereas the ruggedized enclosure 128 primarily protects a single plugin-pod 120, the ruggedized enclosure 208 is structured to protect a plurality of plugin-pods 120.

Turning again to FIGS. 2A and 2B, the components depicted therein may belong to a kit according to some embodiments. The kit includes the ECU 200 and the plugin-pod 120. The kit further comprises an engine configured to be installed in a vehicle (not shown). The ECU 200 is configured to control the engine and comprises a PCB 202 protected within a substantially hermetic enclosure. The plugin-pod 120 is compatible with ECU 200 and is configured to connect externally to the ECU via a connector, receive signals from the connector, process the signals, and output the processed signals at the connector. The plugin-pod 120 is further configured to communicate with sensors, actuators and/or the ECU 200 so as to manage at least one characteristic output of the application, and to extend functionality of the ECU 200. For example, in some embodiments, the plugin-pod 120 is configured to extend functionality of the ECU 200 so as to control newly added sensors and/or actuators. The plugin-pod 120 of FIG. 2A is a plugin-pod with a two-sided connector as shown in FIGS. 1A-1B, and the plugin-pod 120 shown in FIG. 2B is a one-sided connector having both input and output functionality as shown in FIG. 1C.

Figure 9:
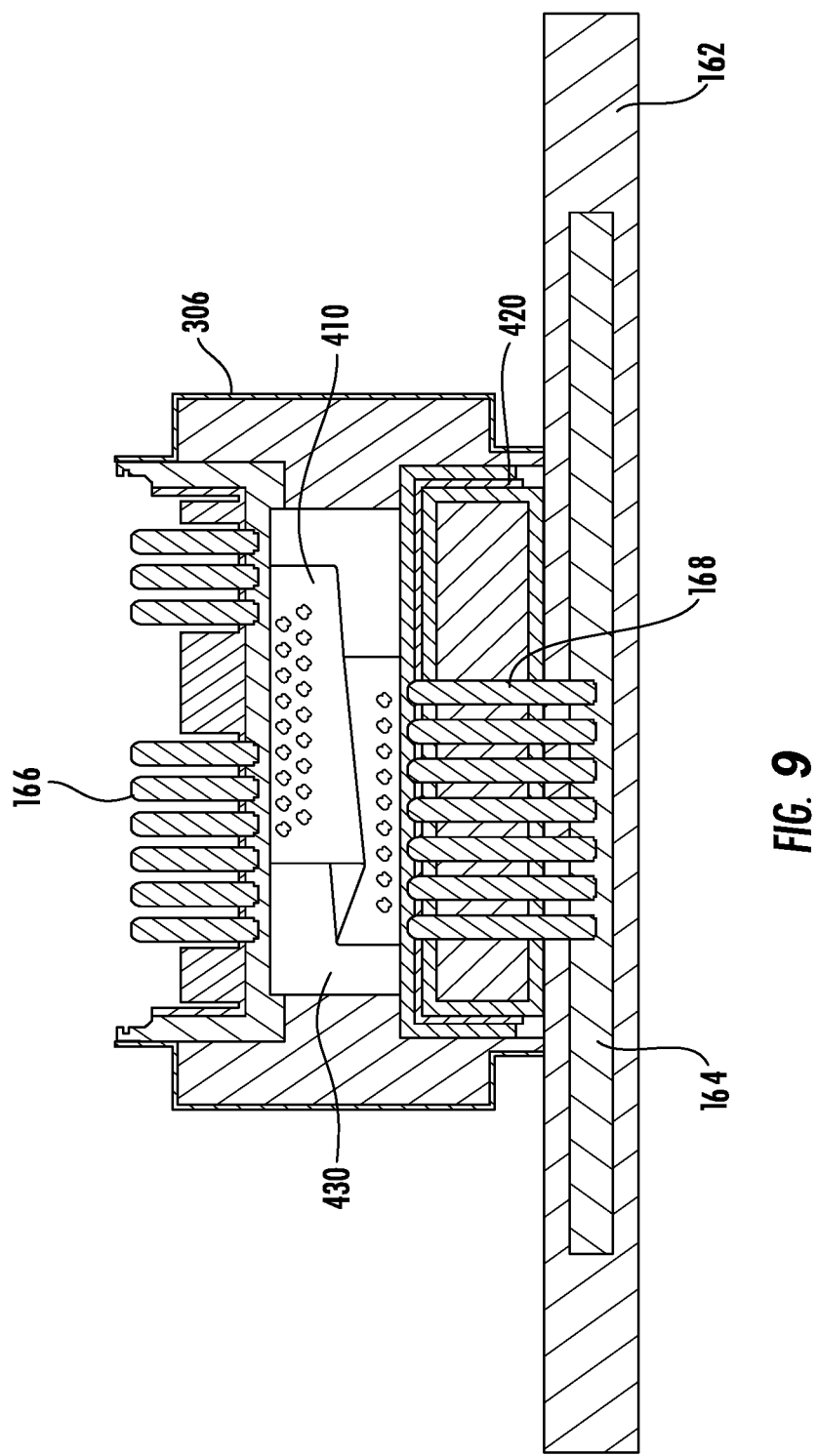
FIG. 9 is a depiction of an assembly of an ECU with an adapter-connector, according to an example embodiment.

Referring now to FIG. 9, an adapter-connector attached externally to an ECU according to an embodiment is depicted. An integrated electronic control unit assembly includes an ECU and one or more adapter-connectors. The one or more adapter-connectors includes a rigid or flexible PCB 164 with routing elements and/or electronic components, an ECU-side connector (a generic connector) or receptacle 168, an engine-side connector 166 (an application specific connector), and a hermetic enclosure 162. The ECU further includes a rigid or flexible PCB with routing elements and/or electronic components, one or more connectors, and a hermetic enclosure. Further, the ECU-side connector of one or more adapter-connectors is configured to mate with an existing connector of the ECU and is hermetic after mating. Additionally, the engine-side connector of the adapter-connector is configured to mate with engine hardware, and is hermetic after mating.

In particular, a portion of a system is shown including an ECU comprising a common PCB in a lower enclosure portion that contacts an upper enclosure portion 420. A flexible connector 410 is provided in an interior space 430 of an upper enclosure portion 420. The connector 410 comprises at least one flexible circuit. The PCB 164 may comprise at least one microcontroller.

Figure 10:
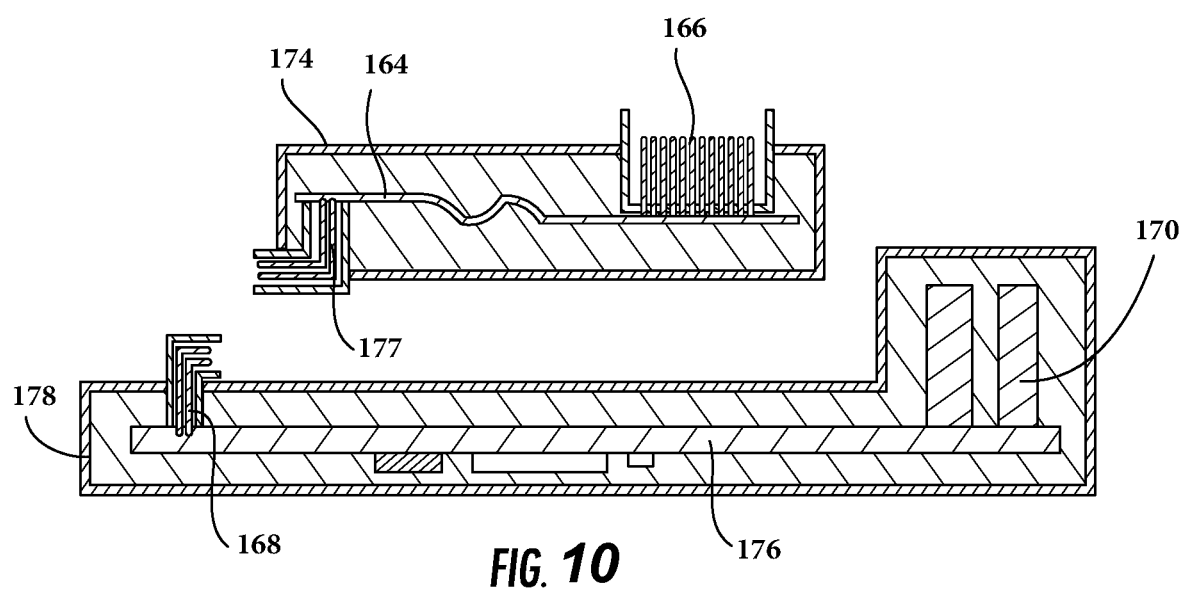
FIG. 10 is a depiction of an adapter module assembly according to an example embodiment.

Referring to FIG. 10, an adapter module assembly according to an example embodiment is depicted. An adapter module is a type of plugin-pod which, when plugged into an ECU, allows the ECU to adapt to different applications. An adapter module is provided within a housing 174 and comprises the flexible or rigid PCB 164, along with an application specific connector (e.g., application-specific pin connector arrangement 166) and pins 177. The pins 177 mate horizontally with generic pin connector arrangement 168 provided for a PCB 176 in an ECU disposed beneath the PCB 164 and enclosed within a housing 178. The generic pin connector arrangement 168 and the application-specific pin connector arrangement 166 may have differing or equal numbers of pins.

Referring again to FIG. 10, the ECU includes components 170 which may be relatively tall and which may also be critical components provided with cooling mechanisms such as heat sinks. The housings 174, 178 accommodate the components 170. As shown on the left side of FIG. 10, pins 177 from PCB 164 are disposed so as to align vertically with pins of the generic pin connector arrangement 168 extending from PCB 176. Thus, first connectors connected to PCB 164 and second connectors connected to PCB 176 are configured to be adjacent to each other when mated.

Referring now to FIGS. 4, 5, 6A, 6B, 6C, 6D, 6E, 6F and 6G, for example, the ECU 200 may be configured to interface with a plurality of plugin-pods, as is also shown in FIG. 3. The plugin-pods may include, for example, a flashlight pod 602, a memory extender pod 604, an additional processing pod 606, a wireless router pod 608, a functionality extender pod 610, a distributed control pod 612, a wireless signal booster/relayer pod 614, a power conversion pod 616, a pluggable fault reader 618 including a screen, an ECU functionality and mounting checker (checking) pod 620, and an ECU GPS and telematics pod 622, for example, as shown in FIGS. 6A-6G. In particular, the ECU 200 may be configured to interface with any of the foregoing pods separately or in any combination, and may be further configured to interface with one or more additional pods. The following table describes various plugin-pod configurations, compositions and functionality.

TABLE 1

| Plugin-Pod Configuration | Composition | Function |
|---|---|---|
| Flashlight Pod | Single Connector Pod, Flexible Stem and LED/Bulb Light | When connected, emits light. Configured for lighting under-hood area. Bulb may be replaced with various other lights for other functionality, e.g., Black Light bulb, Infra-red Light bulb, etc. |
| Memory Extender Pod | Extra Memory (variation of RAM & ROM) and Single Connector Pod | Allows extension of memory when connected to ECU. Configured for read & write purposes |
| Additional Processing Pod | Extra Processor, related components and Single Connector Pod | Allows for adding additional processing power to ECU. Configured to be used for any kind of processing, e.g., audio, video, arithmetic, etc. |
| Wireless Router Pod | Wireless Circuitry, antenna and Single Connector pod | Allows addition of wireless communication capability to any supported ECU; configured to communicate with a Mobile Application, Sensors and/or Actuators |
| Functionality Extender Pod | Driver Circuits and Double Connector Pod | Allows driving & sensing additional actuators and sensors |
| Distributed Control Pod | Wired/Wireless Communication Circuits, Double/Single Connector Pod. | Facilitates Distributed Control Architecture and supports communication between multiple ECUs |
| Wireless Signal Booster/Relayer Pod | Wireless Communication Circuitry, Wireless Link Boost Circuitry and Single Connector Pod | Receives Signal/Data from other pods, sensors & actuators, boosts the signal and relays to other pods, sensors & actuators |
| Power Conversion Pod | Voltage Conversion Circuitry, 2 pin or 3 pin AC plug connector and Double Connector Pod | Allows conversion of 12/24/36/48 volts DC to 120/230 volts AC. Configured to connect any wall-connect appliances e.g. mobile charger, electric-saw, etc. |
| Pluggable Fault Reader Pod | CAN Communication Circuitry, Screen Circuity, Screen and Single/Double Connector Pod | Facilitates reading data from ECU for Fault Check without removing main ECU connectors, and displays readouts on a screen of the Pluggable Fault Reader Pod |
| ECU Functionality & Mounting Checker Pod | Accelerometer, Magnetometer, Circuits to communicate with ECU, LED or Bulb Light and Single Connector Pod | Facilitates proper orientation of ECU on engine; checks ECU functionality |

TABLE 1-continued

| Plugin-Pod Configuration | Composition | Function |
| --- | --- | --- |
| ECU GPS & Telematics Pod | GPS Circuitry, Telematics Circuitry, Circuitry for communication with ECU and Single Connector Pod | Receives GPS data from satellite, communicates to satellite & local antenna/base station(s) for facilitating telematics |

Figure 4:
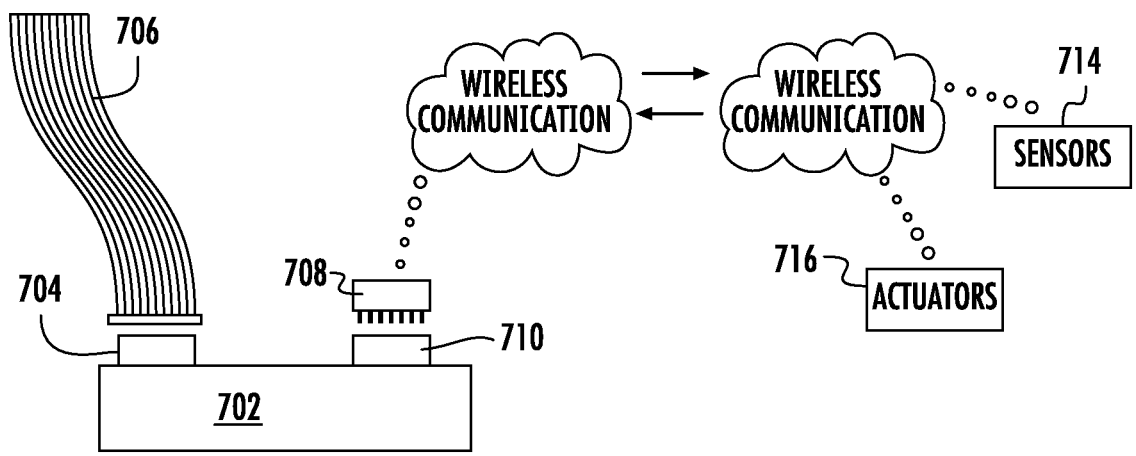
FIG. 4 is a depiction of a plugin-pod as a wireless router, according to an example embodiment.

In particular, as shown in FIG. 4, an ECU 702 is configured to connect to an ECU connector 704 for an engine harness 706. The ECU 702 is further configured to connect to a plugin-pod connector 710. The plugin-pod connector 710 in turn is configured to connect to a plugin-pod 708. The plugin-pod 708 according to the embodiment of FIG. 4 is configured to as a wireless router to facilitate wireless communication, e.g., between the ECU and one or more other elements. For example, the plugin-pod 708, configured as a wireless router, may facilitate communication between the ECU 200 and one or more actuators 716, and/or one or more actuators 714. The one or more actuators 716 and/or the one or more sensors 714 are themselves configured to have wireless communication capability.

Figure 5:
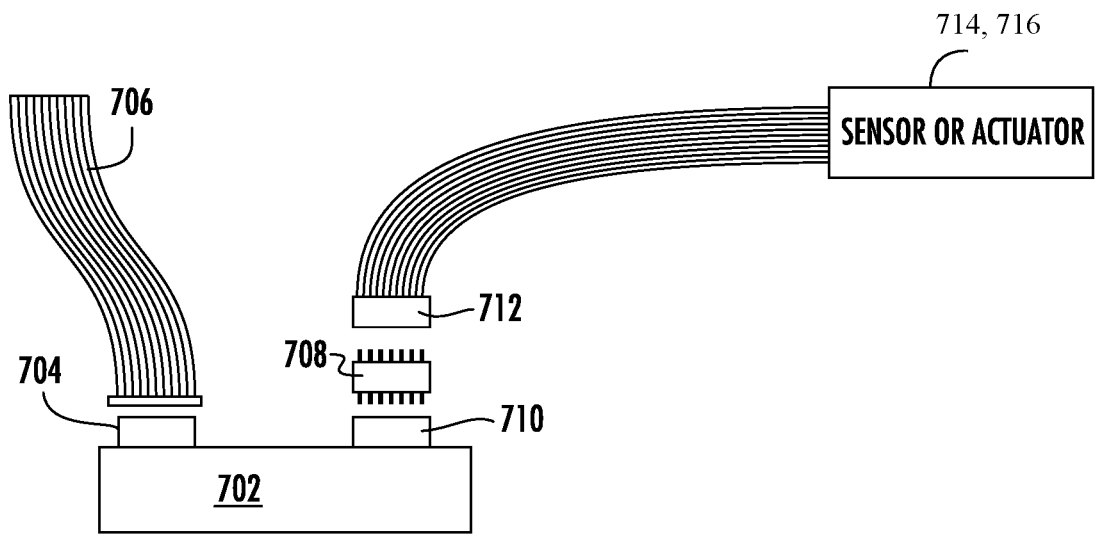
FIG. 5 is a depiction of a plugin-pod as a functionality extender, according to an example embodiment.

Turning now to FIG. 5, a plugin-pod according to an embodiment may be configured as a functionality extender, i.e., a component that extends existing functionality of an ECU, such as the ECU 702 shown in FIG. 4. In particular, the plugin-pod may extend sensing and/or actuation capabilities of the ECU 702. The ECU 702 of FIG. 5 is configured to connect to the ECU connector 704 and engine harness 706 as shown in FIG. 4. Further, like the embodiment of FIG. 4, the ECU 702 of FIG. 5 is further configured to connect to the plugin-pod connector 710 which in turn connects to the plugin-pod 708. In contrast to FIG. 4, the plugin-pod 708 of the embodiment shown in FIG. 5 is not configured as a wireless router, but is instead configured to connect to a connector for an added actuator or sensor harness, e.g., for one or more actuators 716 and/or one or more sensors 714.

Figure 6E:
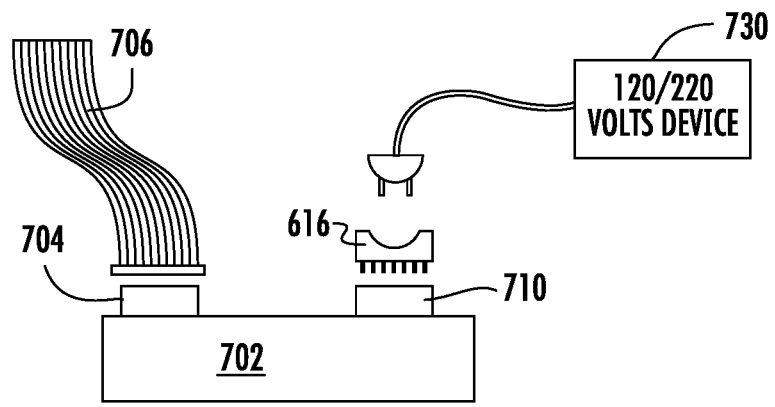

FIG. 6A depicts a plurality of plugin-pods as described in Table 1. FIGS. 6B-6G depict systems each including an ECU and at least one of the plugin-pods illustrated in FIG. 6A. FIGS. 6B-6G depict an ECU 702 (as shown in FIGS. 4 and 5) connected to an ECU connector 704 for an engine harness 706. As in FIGS. 4 and 5, the ECU 702 is further configured to connect to a plugin-pod connector 710, which is in turn is configured to connect to a plugin-pod. The plugin-pod shown in FIG. 6B is an ECU functionality and mounting checker (checking) pod 620 which includes a light 726, such as an LED or a bulb and which checks the functionality and/or orientation of the ECU. The plugin-pod shown in FIG. 6C is a flashlight pod 602 which is connected to a flexible stem 732. The flashlight pod 602 is located at a first end of the flexible stem 732 and light such as an LED or bulb 726 is located at a second end of the stem. The light 726 is configured to illuminate an area under the hood of a vehicle. Instead of a regular light bulb, the light 726 may be a black light bulb, infra-red light bulb, or another type of light bulb.

Figure 6F:
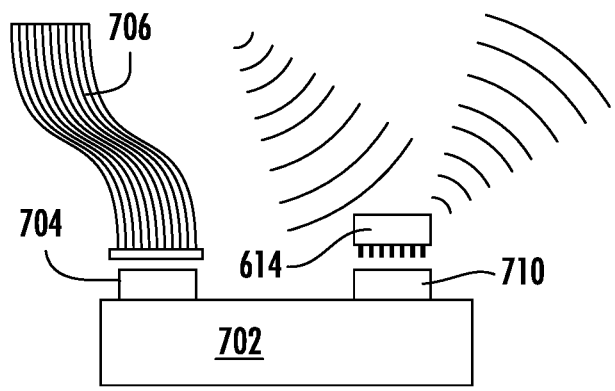
Figure 6G:
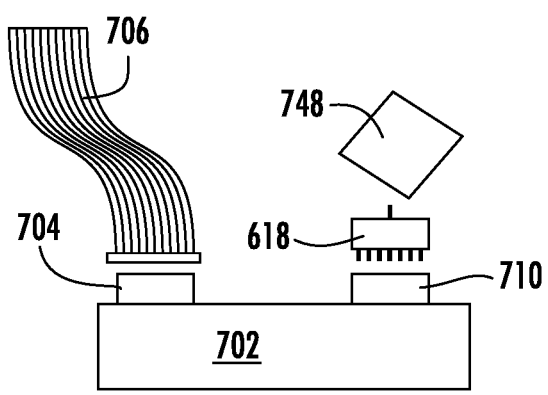

Turning now to FIG. 6D, the plugin-pod depicted therein is an ECU Global Positioning System (GPS) and telematics pod 622. The GPS and telematics pod 622 is configured to receive GPS data from a satellite 750 and facilitate telematics communication with the satellite 750 and one or more local antennas 728 and/or base station(s). The plugin-pod shown in FIG. 6E is a power conversion pod 616 which allows conversion of 12/24/36/48 volts DC to 120/230 volts AC. The power conversion pod 616 is configured to connect to a 120/220 volt device 730 such as a wall-connect appliance, for example, a mobile charger, electric saw, etc. The plugin-pod shown in FIG. 6F is a signal booster and relayer pod 614 which is configured to receive incoming signals or data from one or more other pods, sensors and/or actuators, boost the signal, and relay the outgoing signal to one or more other pods, sensors and/or actuators. The plugin-pod shown in FIG. 6G is a pluggable fault reader pod 618 including a screen 748. The pluggable fault reader pod 618 facilitates reading data from the ECU 702 for fault checking, without removing the main ECU connectors, and is further configured to display readouts on the screen 748. The plugin-pods shown in FIGS. 6B-6G are provided by way of example and are not limitative, as the ECU 702 may be configured with a plurality of other pods, including those additional pods listed in Table 1 and others.

Any or all of such plugin-pods may include H-bridge circuitry to permit voltage to be applied across a load in either direction. Further, the ECU 200 may be provided with a given number of connectors to permit interfacing with a plurality of such plugin-pods. In one embodiment, the ECU 200 has 50-250 pins (such as the connectors 124, 130 shown in FIGS. 1A-1C). In another embodiment, the ECU 200 has 50-150 pins.

Referring again to FIGS. 2A and 2B, arrangements for an ECU 200 and plugin-pod 120 are shown according to one embodiment. The ECU 200 includes a PCB 202. The PCB 202 may be configured with a processor and a memory. The processor may be implemented as a general-purpose processor, an application specific integrated circuit (ASIC), one or more field programmable gate arrays (FPGAs), a digital signal processor (DSP), a group of processing components, or other suitable electronic processing components. The one or more memory devices (e.g., RAM, ROM, Flash Memory, hard disk storage, etc.) may store data and/or computer code for facilitating various processes. Thus, the one or more memory devices may be communicably connected to the processor and provide computer code or instructions to the processor for executing the processes described in regard to the ECU 200 herein. Moreover, the one or more memory devices may be or include tangible, non-transient volatile memory or non-volatile memory. Accordingly, the one or more memory devices may include database components, object code components, script components, or any other type of information structure for supporting the various activities and information structures described herein.

While various pods with particular functionality are shown in FIGS. 6A-6G, and are described in Table 1, it should be understood that any single aforementioned plugin-pod described above need not be a sole plugin-pod, and that a plurality of plugin-pod s may be provided for completing certain functions. Further, while the activities of multiple pods may be combined as a single pod, additional pods with additional functionality may be included, etc. Additionally, it should be understood that the ECU 200 may further control other engine and/or vehicle activity beyond the scope of the present disclosure. For example, in addition to the aftertreatment and exhaust gas recirculation implementations discussed below, the ECU 200 may be used as an embedded control system in a wide variety of implementations, e.g., for a variable geometry actuator in a turbocharger to vary geometric parameters, in a low pressure pump, a fuel control valve, or an inlet metering valve.

The ECU 200 may be structured to provide various engine operation commands to an engine so as to adjust one or more operating parameters of the engine. Further, certain operations of the ECU 200 may include operations to interpret and/or to determine one or more parameters. Interpreting or determining, as utilized herein, includes receiving values by any method known in the art, including at least receiving values from a datalink or network communication, receiving an electronic signal (e.g. a voltage, frequency, current, or PWM signal) indicative of the value, receiving a computer generated parameter indicative of the value, reading the value from a memory location on a non-transient computer readable storage medium, receiving the value as a parameter by any means known in the art, and/or by receiving a value by which the interpreted parameter can be calculated, and/or by referencing a default value that is interpreted to be the parameter value.

Figure 7:
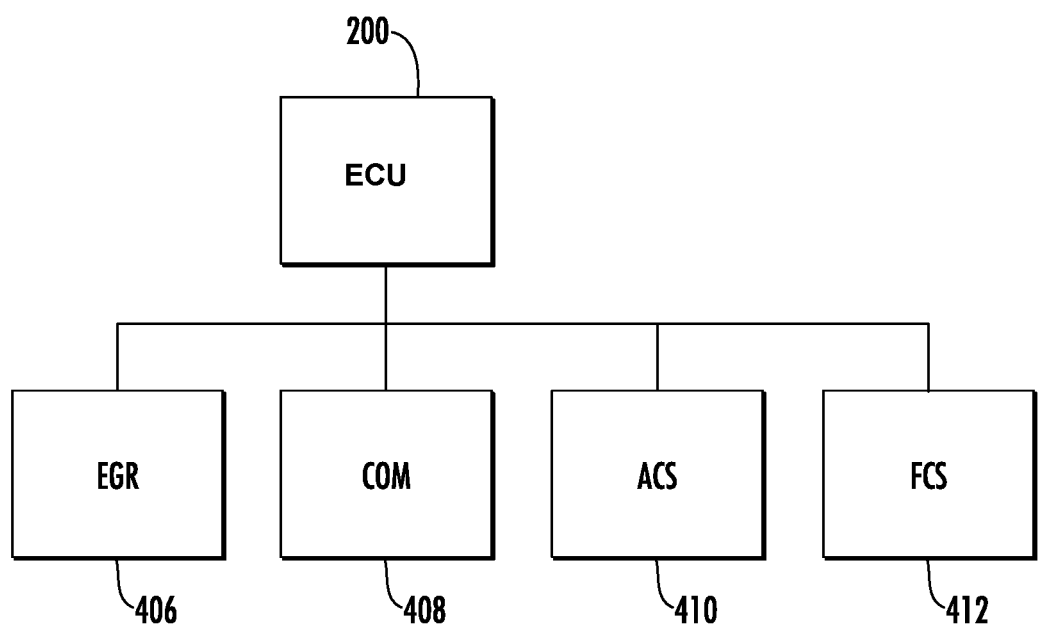
FIG. 7 is a block diagram of an ECU configured with plugin-pods, according to an example embodiment.

Referring now to FIG. 7, further examples of plugin-pods are depicted according to an embodiment. As shown in FIG. 7, the ECU 200 may be configured to interface with a plurality of plug-in pods, for example, an exhaust gas recirculation (EGR) plugin-pod 406, a communication plugin-pod 408, an aftertreatment control plugin-pod 410, and a fuel control plugin-pod 412. The EGR plugin-pod 406 comprises a controller configured to recirculate exhaust gas, the communication plugin-pod 408 may be configured to facilitate wireless or wired communication (e.g., WiFi, Bluetooth, CAN, LIN, etc., separately or in any combination), as may be selected during the design process. The aftertreatment plugin-pod 410 may be configured to control emissions from an engine, as is discussed in more detail below. The fuel control plugin-pod 412 may be configured to regulate consumption of fuel.

As noted above, at least one embodiment includes a plugin-pod for an ECU designed to control aftertreatment of engine exhaust for an internal combustion (IC) engine. Aftertreatment systems on engines are becoming increasingly widespread due to the implementation of stricter emission requirements for internal combustion engines on a global scale. Such aftertreatment applications may help to ensure that engine emissions are in compliance with governmental standards, such as those set by the Environmental Protection Agency (EPA) in the United States.

Exhaust aftertreatment systems are generally designed to reduce emission of particulate matter, nitrogen oxides (NOx), hydrocarbons, and other pollutants. A plugin-pod 120 such as that shown in FIGS. 1A-1C can be used to expand existing functionality to allow various aftertreatment-related applications, such as on-board diagnostic (OBD) monitoring or testing of aftertreatment components, for example. By way of example, components for certain exhaust aftertreatment systems for diesel-powered IC engines may include a diesel oxidation catalyst (DOC), a diesel particulate filter (DPF), a decomposition reactor tube (DRT), a selective catalytic reduction (SCR) device, an SCR on filter (SCRF), and/or an ammonia slip catalyst (ASC) (also referred to as an ammonia oxidation catalyst (AMOX)). Each of the DOC, DPF, DRT, SCR device, SCRF, and/or the ASC components are configured to perform a certain exhaust emissions treatment operation on exhaust gas passing through or over the respective components.

Figure 8:
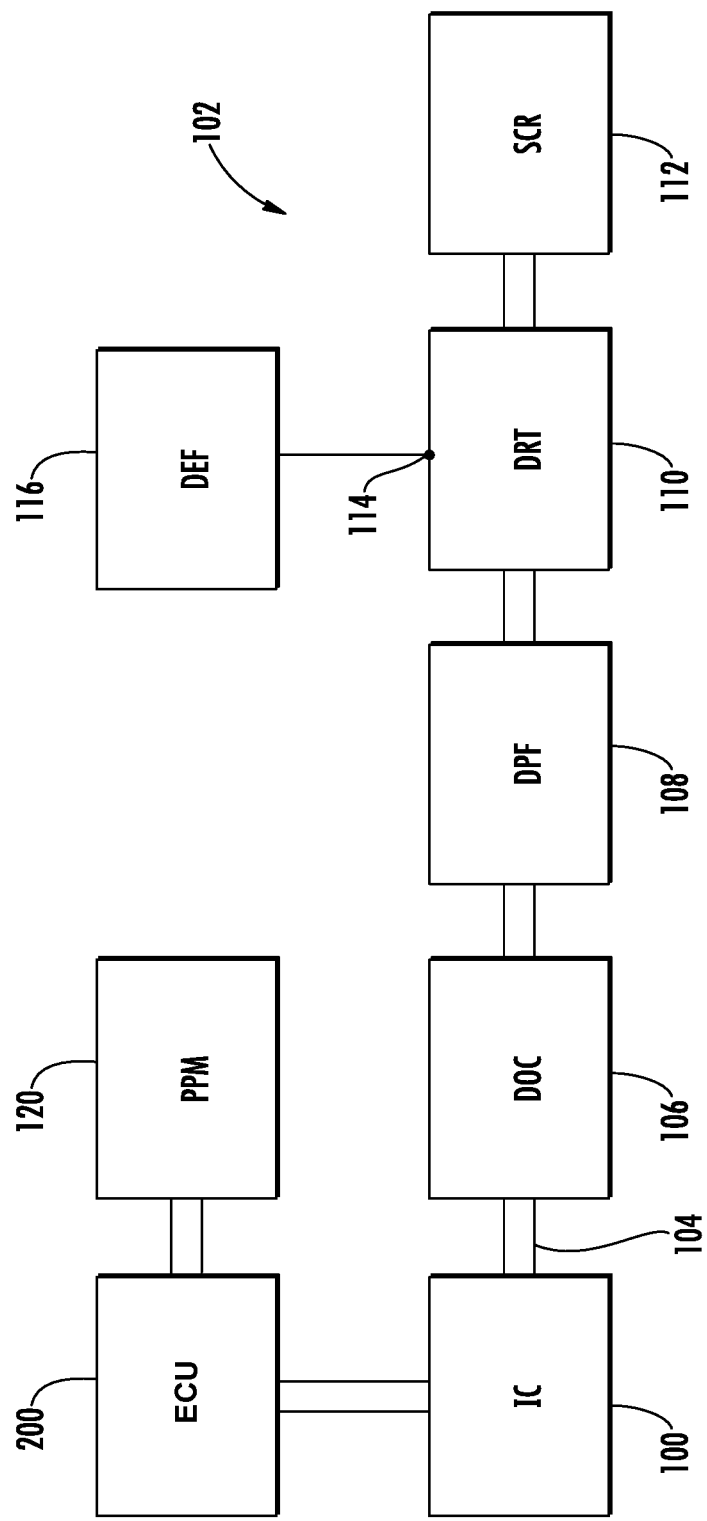
FIG. 8 is a block diagram of an aftertreatment system, according to an example embodiment.

FIG. 8 is a block diagram illustrating an IC engine 100 and a representative exhaust aftertreatment system 102 including an IC engine 100. The aftertreatment system 102 is controlled by the plugin-pod 120, which is configured here as an example of the aftertreatment plugin-pod 410. The plugin-pod 120 is coupled with the ECU 200 of the IC engine 100. The IC engine 100 can be a compression-ignited IC engine, such as a diesel or compressed natural gas fueled engine, or a spark-ignited internal combustion engine, such as a gasoline fueled engine. During operation, the IC engine 100 expels exhaust gas, which flows downstream from the IC engine 100 through an exhaust passage 104 and through the components of the aftertreatment system 102. An exhaust outlet (not shown) is disposed at an end of the exhaust passage 104 and configured to output exhaust from the engine 100. Generally, the aftertreatment system 102 is configured to remove various chemical and particulate emissions present in the exhaust gas. The aftertreatment system 102 may include at least one exhaust adsorber, among other components as discussed below.

The aftertreatment system 102 may include a DOC 106 and/or a DPF 108 positioned downstream of the DOC 106. The DOC 106 is generally configured to reduce the amount of CO and HC present in the exhaust gas via oxidation techniques, as well as to convert NO to $NO_2$ for passive regeneration of soot captured by the DPF 108. The DPF 108 is generally configured to filter particulate matter and soot in the exhaust gas.

The aftertreatment system 102 may also include a DRT 110 positioned downstream of the DPF 108 and an SCR device 112 positioned downstream of the DRT 110. A reductant injector 114 is operatively coupled to the DRT 110. The reductant injector 114 is configured to inject a reductant such as diesel exhaust fluid (DEF) from a storage tank 116. Once the DEF is injected into the DRT 110, the DEF is heated by the exhaust gas stream to trigger its decomposition into ammonia ($NH_3$) through hydrolysis. The SCR device 112 is configured to convert $NO_x$ within the exhaust gas stream into harmless nitrogen gas ($N_2$) and water vapor ($H_2O$). The $NO_x$ and the ammonia converted from DEF within the DRT 110 pass over a catalyst within the SCR device 112, and a catalytic reaction takes place.

In the example above, the aftertreatment control system 102 has the plugin-pod 120 to support aftertreatment control. The plugin-pod 120 is configured to control the various components of the aftertreatment control system 102 as an aftertreatment controller, and to communicate with the PCB 202 of the ECU 200. The ECU 200 is further configured with a first connector configured to connect to aftertreatment control components, and a second connector configured to connect to the plugin-pod 120. The connectors facilitate connection of the plugin-pod 120 without requiring additional drivers. The connectors may be structured to withstand particular ranges of pressure (e.g., pressures of about 4.2 psi or less, for example, so as to withstand pressure washing at such pressure), be substantially dust-resistant and waterproof as per Ingress Protection Standards, and be operable at automotive temperature ranges and in harsh environments.

As described above, the foregoing embodiments allow for expanded functionality via plugin-pods that support additional applications beyond those supported by a base, highly capable PCB. Such embodiments therefore avoid drawbacks associated with having unique ECUs, which require new PCBs for each unique application. Requiring unique PCBs to be made increases the number of required parts, reduces the volume for any one version, and necessitates support for multiple products throughout their lifetimes. Such an approach has the further disadvantages of generally higher piece-part costs and higher non-recurring engineering cots, because the cost is shared among fewer modules.

Further, the embodiments described above offer additional benefits in comparison to systems in which components may be populated or non-populated to provide functionality per various application requirements. By requiring components to be populated or non-populated, the number of PCB variants is generally increased. Thus, the quantity of any particular configuration or variant of PCB is decreased. This approach therefore also suffers from higher piece part costs per ECU. Moreover, this approach does not allow for re-configurability after the ECU is manufactured. In contrast, applicant's embodiments may be configured during engine or vehicle assembly, while in service, or in the field, as noted above.

It should be noted that each block of the block diagrams, and combinations of blocks in the block diagrams, can be implemented by special purpose hardware-based systems that perform the specified functions or acts, or combinations of special purpose hardware and program code.

Many of the functional units described in this specification have been labeled as pods, units or modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in machine-readable medium for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in a machine-readable medium or media (or a computer-readable medium or media), the computer readable program code may be stored and/or propagated on in one or more computer readable media.

The computer readable medium or media may be a tangible computer readable storage medium or media storing the computer readable program code. The computer readable storage medium or media may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium or media may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium or media may also be a computer readable signal medium or media. The computer readable signal medium or media may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing.

In one embodiment, the computer readable medium or media may comprise a combination of one or more computer readable storage media and one or more computer readable signal media. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on a user's computer, partly on the user's computer, as a stand-alone computer-readable package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Accordingly, the present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A ruggedized electronic control unit (ECU) system comprising:
   a plugin-pod including a first connector configured to connect to an ECU;
   a second connector that is a connector of the ECU;
   signal processing circuitry; and
   a ruggedized enclosure for the first connector and the signal processing circuitry, the ruggedized enclosure being configured to mount the plugin-pod to the ECU, wherein:
   the first connector includes pins arranged to mate horizontally with pins of the second connector;
   the ECU is disposed beneath the plugin-pod and enclosed within a housing;
   a surface of the housing of the ECU is disposed to contact a surface of the plugin-pod when the ECU and the plugin-pod are connected; and
   at least a portion of the pins of the first connector are arranged to align vertically with at least a portion of the pins of the second connector.

2. The ruggedized ECU system of claim 1, wherein:
   the signal processing circuitry includes signal processing circuitry configured to receive signals from the first and second connectors, process the signals, and output the processed signals at the first and second connectors.

3. The ruggedized ECU system of claim 2, wherein the ruggedized ECU is configured to dissipate heat from the signal processing circuitry.

4. The ruggedized ECU system of claim 1, wherein:
   a position of the ECU is defined along an x-axis, a y-axis, and a z-axis,
   the ECU is subject to vibrations along the x-axis, the y-axis, and the z-axis, and
   the plugin-pod is configured to withstand vibrations of about 15G or more.

5. The ruggedized ECU system of claim 1, wherein the ruggedized ECU is chemically-resistant so as to withstand exposure to non-polar solvents, polar solvents, diesel fuel, motor oil, gas, brake fluid, engine oil, coolant, antifreeze, coffee, carbonated beverages, detergents, degreasers, grease and battery acid.

6. The ruggedized ECU system of claim 1, wherein the plugin-pod is at least one selected from the group consisting of a flashlight pod, a memory extender pod, a wireless router pod, a pod configured to carry out additional processing, a pod configured to extend existing functionality, a distributed control pod, a wireless signal booster/relayer pod, a power conversion pod, a pluggable fault reader pod, an ECU checking pod, and a GPS/telematics pod.

7. The ruggedized ECU system of claim 1, wherein the enclosure is dust-resistant and waterproof in accordance with Ingress Protection Standards IP-69 and IP-69K.

8. The ruggedized ECU system of claim 1, wherein the ECU is configured to withstand ranges of pressure.

9. The ruggedized ECU system of claim 1, wherein the signal processing circuitry is configured to be operable between −40° C. and 105° C.

10. The ruggedized ECU system of claim 1, wherein the signal processing circuitry further comprises a microprocessor and memory.

11. The ruggedized ECU system of claim 1, wherein the signal processing circuitry is configured to at least one of: (1) enable the ECU to communicate via Bluetooth, (2) perform aftertreatment control to control emissions, (3) control fuel management, or store memory.

12. The ruggedized ECU system of claim 1, wherein the ECU is disposed in a hermetic enclosure.

13. The ruggedized ECU system of claim 1, wherein the pins of the first connector of the plugin-pod include a first plurality of pins on a first side thereof and a second plurality of pins on a second side thereof, the second side spaced from the first side.

14. The ruggedized ECU system of claim 13, wherein the ruggedized enclosure is structured to enclose at least part of the pins of the second connector.

* * * * *